(12) United States Patent
Park et al.

(10) Patent No.: US 7,830,728 B2
(45) Date of Patent: Nov. 9, 2010

(54) SEMICONDUCTOR MEMORY DEVICE

(75) Inventors: Ki-Chon Park, Gyeonggi-do (KR);
Byoung-Jin Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 146 days.

(21) Appl. No.: 12/327,203

(22) Filed: Dec. 3, 2008

(65) Prior Publication Data
US 2010/0077125 A1    Mar. 25, 2010

(30) Foreign Application Priority Data
Sep. 22, 2008    (KR) .................. 10-2008-0092881

(51) Int. Cl.
*G11C 7/00*    (2006.01)
(52) U.S. Cl. .................. 365/189.15; 365/189.16; 365/189.17; 365/189.18
(58) Field of Classification Search ........... 365/189.15, 365/189.16, 189.17, 189.18
See application file for complete search history.

(56) References Cited

U.S. PATENT DOCUMENTS

| | | | | |
|---|---|---|---|---|
| 5,535,405 | A * | 7/1996 | Byers et al. .................. | 710/110 |
| 6,791,777 | B2 * | 9/2004 | Watanabe et al. ............. | 360/51 |
| 7,274,604 | B2 * | 9/2007 | Choi .......................... | 365/193 |

FOREIGN PATENT DOCUMENTS

| KR | 1020070045644 A | 5/2007 |
|---|---|---|
| KR | 1020080107763 A | 12/2008 |

OTHER PUBLICATIONS

Notice of Allowanve issued from Korean Intellectual Property Office on Nov. 27, 2009.

* cited by examiner

*Primary Examiner*—Son Dinh
(74) *Attorney, Agent, or Firm*—IP & T Group LLP

(57) ABSTRACT

Disclosed is a semiconductor memory device includes a selector for selectively loading read inversion information and write inversion information on an inversion bus, the inversion bus for transferring the inversion information loaded by the selector, a plurality of read inversion units for reflecting the inversion information from the inversion bus to output data, and a plurality of write inversion units for reflecting the inversion information from the inversion bus to input data.

13 Claims, 10 Drawing Sheets

FIG. 1
(RELATED ART)

| BANK0 10 | X | X | BANK2 30 | BANK0 50 | X | X | BANK2 70 |
|---|---|---|---|---|---|---|---|
| Y | | | Y | Y | | | Y |
| Y | | | Y | Y | | | Y |
| BANK1 20 | X | X | BANK3 40 | BANK1 60 | X | X | BANK3 80 |
| DPERI | | | CPERI | | | DPERI | |
| BANK0 90 | X | X | BANK2 110 | BANK0 130 | X | X | BANK2 150 |
| Y | | | Y | Y | | | Y |
| Y | | | Y | Y | | | Y |
| BANK1 100 | X | X | BANK3 120 | BANK1 140 | X | X | BANK3 160 |

SEMICONDUCTOR MEMORY DEVICE

CROSS-REFERENCE TO RELATED APPLICATIONS

This application claims priority to Korean patent application number 10-2008-0092881, filed on Sep. 22, 2008 which is incorporated by reference in its entirety.

BACKGROUND OF THE INVENTION

The present subject matter relates to a semiconductor memory device, and more particularly, to a technology for reducing an overall size of a semiconductor memory device by reducing an area of an inversion bus.

A write data bus inversion (WDBI) function is used to reduce simultaneous switching output (SSO) noise by minimizing data variation when data is inputted to a memory device. Meanwhile, a read data bus inversion (RDBI) function is used to reduce the SSO noise by minimizing data variation when data is outputted from a memory device.

The memory device determines whether data is inverted data or not by receiving inversion information such as WDBI together with data from a memory controller to a memory device when data is inputted, and the memory device also determines whether data is inverted data or not by receiving inversion information such as RDBI together with data from the memory device to the memory controller when data is outputted.

FIG. 1 is a diagram illustrating a semiconductor memory device having a four-bank quarter structure according to the related art.

Referring to FIG. 1, each of four banks is divided into four sectors. In FIG. 1, 'X' denotes circuits for row operations, and 'Y' denotes circuits for column operations.

Also, 'CPERI' denotes a region having circuits related to a clock. 'DPERI' denotes a region having circuits related to data input and data output.

FIG. 2 is a diagram illustrating exchanging data and inversion information between data input circuits and banks. FIG. 2 shows only one quarter.

As shown in FIG. 2, DQ blocks 210 to 280 are blocks having a data input circuit and a data output circuit, which are disposed in each of data pins. A DBI block 290 denotes a block having an inversion input circuit and an inversion output circuit, which are disposed in a DBI pin.

At first, data flow in a memory device for a read/write operation will be described.

In a write operation, data is consecutively inputted to data pins of a memory device in serial. The data pins include data input circuits 210 and 280, respectively. Actually, the data input circuits are included in the DQ blocks 210 and 280. For convenience, reference numerals 210 to 280 are assigned to the data input circuits, hereinafter. The data input circuits 210 to 280 sort serially inputted data to parallel data and transfer the parallel data to global lines GIO0<0:7> to GIO7<0:7>. If the memory device employs a 8-bit prefetch scheme, the data input circuits 210 to 280 sort serially inputted 8 data to parallel data and transfer the parallel data to the global lines GIO0<0:7> to GIO7<0:7>. That is, data inputted to one DQ pin, for example, DQ0, is converted to parallel data, and the parallel data is loaded on a global line, for example, GIO0<0:7>. Such global lines GIO0<0:7> to GIO7<0:7> are connected to Y blocks 11, 21, 31, and 41 of all banks, and data are written in parallel at one of banks 10 to 40 selected by a bank address.

In a read operation, data are outputted from one of the banks 10 to 40 selected by a bank address in parallel. The data pins include data output circuits 210 to 280, respectively. Actually, the data output circuits are included in the DQ blocks 210 and 280. For convenience, reference numerals 210 to 280 are assigned to the data output circuits, hereinafter. The data output circuits 210 to 280 sort data that are transferred in parallel through global lines GIO0<0:7> to GIO7<0:7> and output the sorted data to the outside of a chip through the data pins. For example, if the memory device employs a 8-bit prefetch scheme, data transferred through 8 global lines such as GIO0<0:7> to a data output circuit such as 210 are sorted into serial data, and the serial data is outputted through data pins.

Although the global lines GIO0<0:7> to GIO7<0:7> transfer data of a read path and data of a write path in the memory device of FIG. 2, two separate global lines may be included in a memory device for transferring data of a read path and data of a write path according to design. For example, GIO may be divided into RGIO and WGIO.

Flow of inversion information DBI for a read/write operation of a memory device will be described.

In a write operation, write inversion information WDBI is consecutively inputted to an inversion pin in serial. The write inversion information WDBI denotes whether data inputted from the outside of a memory is inverted data or not in a write operation. An inversion input circuit 290 sorts serially inputted write inversion information WDBI to parallel data and transfers the parallel data to the write inversion bus WDBI<0:7>. Actually, the inversion input circuit is included in the DBI block 290. For convenience, a reference numeral 290 is also assigned to the inversion input circuit, hereinafter. The WDBI uses the same prefetch scheme. Therefore, if the memory device employs a 8-bit prefetch scheme, the inversion input circuit 290 sorts serially inputted 8 write inversion information WDBI in parallel data and transfers the parallel data to a write inversion bus WDBI<0:7>. The write inversion bus WDBI<0:7> includes 8 lines.

The write inversion bus WDBI<0:7> transfers the write inversion information to Y blocks 11, 21, 31 and 41, of each bank. The Y blocks 11, 21, 31, and 41 of each bank include write drivers WTDRV for transferring data of global lines GIO0<0:7> to GIO7<0:7> to local lines LIO/LIOB of banks 10, 20, 30, and 40. The write drivers invert and non-invert data of the global lines GIO0<0:7>~GIO7<0:7> according to the write inversion information WDBI<0:7> and transfers the data to the local lines. Since each of the banks 10 to 40 includes local lines LIO/LIOB as many as the number of the global lines GIO0<0:7> to GIO7<0:7>, each of the banks 10 to 40 includes write drivers corresponding to the number of global lines GIO0<0:7> to GIO7<0:7>. For example, a Y block 11 includes 64 write drivers.

In a read operation, an inversion generator 300 in a memory device generates the read inversion information RDBI<0:7>. Since a memory device outputs stored data in the read operation, the memory device must generate read inversion information RDBI<0:7>, inverts or non-inverts data according to the generated read inversion information RDBI<0:7>, and outputs the data. The inversion generator 300 generates read inversion information RDBI<0> as '1' when more than five data among eight data GIO0<0> to GIO7<0> are '0' in a DC mode. The inversion generator 300 generates read inversion information RDBI<0> as '1' if more than 5 data among data GIO0<0> to GIO7<0> transit, compared with previous data in an AC mode. Since a related specification defines how the inversion generator 300 generate read inversion information RDBI<0:7>, detail description thereof is omitted.

The read inversion information generated by the inversion generator 300 is transferred to the read inversion bus RDBI<0:7>, and finally transferred to each of the data output circuits 210 to 280. The data output circuits 210 to 280 invert or non-invert data according to the read inversion information RDBI<0:7>.

The read inversion bus RDBI<0:7> transfers read inversion information to the inversion output unit 290. It is because the memory device must output read inversion information to the outside of a memory device in the read operation.

Since the drawings illustrate one quarter of the memory device having a quarter bank structure, the Y blocks 11, 21, 31, and 41 of each bank are connected to global lines GIO0<0:7>~GIO7<0:7> corresponding to 8 data pins. Remaining banks (not shown) are also connected to global lines corresponding to 8 data pins. For example, banks 50, 60, 70, and 80 are connected to global lines corresponding to $8^{th}$ to $15^{th}$ data pins. Since one inversion pin manages inversion information of data inputted/outputted through 8 data pins, each of remaining quarters includes one inversion pin.

FIG. 3 is a diagram illustrating exchanging data and inversion information between data input circuits 210 to 280 and banks 10 to 40 like FIG. 2. However, parts of the Y blocks 11, 21, 31, and 41 of the bank are disposed around data pins and inversion pins. Like reference numerals denote like element in FIGS. 2 and 3.

Global lines GIO0<0:7> to GIO7<0:7> must be connected from DQ blocks 210 to 280 to each of banks 10 to 40. Write inversion buses WDBI<0:7> are also connected from the DBI block 290 to each of the blocks 10 to 40. Therefore, when the Y blocks 11, 21, 31, and 41 of the banks are disposed like FIG. 2, the lengths of the global lines GIO0<0:7> to GIO7<0:7> and the write inversion buses WDBI<0:7> become excessively longer, thereby occupying a large area in a chip. Therefore, parts of the Y blocks 11, 21, 31, and 41 such as data input/output units 12, 22, 32, and 42 are disposed around data pins and inversion pins in the memory devices as shown in FIG. 3.

The input/output units 12, 22, 32, and 42 are parts for inputting and outputting data in the Y blocks 11, 21, 31, and 41. The input/output units 12, 22, 32, and 42 include a writer driver WTDRV and a sense amp IOSA for exchanging data with the global lines GIO0<0:7> to GIO7<0:7>.

By disposing the input/output units 12, 22, 32, and 42 like FIG. 3, the lengths of the global lines GIO0<0:7> to GIO7<0: 7> and the write inversion bus WDBI<0:7> can be shortened. As a result, the overall area of memory device can be reduced too.

FIG. 4 is a diagram illustrating a data input circuit and a data output circuit in a DQ block 210 of FIG. 2.

The data input circuit 410 includes a data buffer 411, a serial-to-parallel converter 412, and a driver 413.

The data buffer 41 buffers data inputted to a data pad DQ PAD that is a pad on a wafer connected to a data pin and transfers the buffered data to the serial-to-parallel converter 412. Data is consecutively inputted to the data pad according to a prefetch scheme. In case of using an 8 bit prefetch scheme, 8 data are consecutively inputted in serial corresponding to one write command.

The serial to parallel converter 412 sorts inputted serial data to parallel data. How serial data is sorted to parallel data is decided according to a type of a prefetch scheme. For example, in case of using a 8-bit prefetch scheme, 8 serial input data are outputted through 8 lines GIO_PRE0<0:7> in parallel.

The driver 413 loads the parallel data GIO_PRE0<0:7> on the global lines GIO0<0:7>. For example, the driver 413 is strobed by a clock TDQSS_CLK and loads data on the global lines GIO0<0:7>. The TDQSS_CLK is a clock having a cycle as much as a gap between consecutive write commands.

The data output circuit 420 includes an output driver 421, a parallel to serial converter 422, and a read inversion unit 423.

The read inversion unit 423 inverts or non-inverts data GIO0<0:7> to output according to read inversion information RDBI<0:7>. If the read inversion information RDBI<0:7> is '1,' the read inversion unit 423 inverts the data to output. If the read inversion information RDBI<0:7> is '0,' the read inversion unit 433 does not invert the data. The read inversion unit 423, as shown, includes XOR gates for receiving data of the global lines GIO0<0:7> and the read inversion information RDBI<0:7>.

The parallel to serial converter 422 converts parallel data outputted from the read inversion unit 423 to serial data. In case of using a 8-bit prefetch scheme, the parallel to serial converter 422 converts data of 8 lines to serial data. That is, the parallel to serial converter 422 may perform the opposite function of the serial to parallel converter 412.

The output driver 421 outputs the serial data from the parallel to serial converter 422 to the outside of the memory device. That is, the output driver 421 may perform the opposite function of the data input buffer 411.

FIG. 5 is a diagram illustrating an inversion input circuit and an inversion output circuit in a DBI block 290 of FIG. 2.

The inversion input circuit 510 includes an inversion buffer 511, a serial-to-parallel converter 512, and a driver 513.

The inversion buffer 511 buffers write inversion information WDBI_IN inputted to an inversion pad WBI PAD and transfers the buffered write inversion information to the serial-to-parallel converter 512. The write inversion information WDBI_IN is consecutively inputted in serial similar to the data.

The serial-to-parallel converter 512 sorts the serial write inversion information WDBI_IN to parallel data. Except sorting the write inversion information WDBI instead of the data, the serial-to-parallel converter 512 performs the same function of the serial-to-parallel converter 412 of the data input circuit 410.

The driver 513 loads the parallel inversion information WDBI_PRE<0:7> on the write inversion bus WDBI<0:7>. Also, the driver 513 is strobed by a clock TDQSS_CLK and loads the write inversion information WDBI_PRE<0:7> on the write inversion bus WDBI<0:7>.

The inversion output circuit 520 includes a parallel to serial converter 522 and an output driver 521.

The parallel to serial converter 522 converts the read inversion information transferred to the read inversion bus RDBI<0:7> to serial data and outputs the serial data. The output driver 521 outputs the serial read inversion information RDBI_OUT to the outside of the memory device.

FIG. 6 is a diagram illustrating write drivers and write inversion units in an input/output unit 12 of FIG. 3 and an Y block 11 of FIG. 2.

A write inversion unit 610 is disposed in front of write drivers 621 to 628. The write inversion unit 610 inverts or non-inverts data GIO0<0:7> stored in a memory device according to the write inversion information that is transferred through the write inversion bus WDBI<0:7>. If the write inversion information WDBI<0:7> is '1,' the write inversion unit 610 inverts the data. If the write inversion information WDBI<0:7> is '0,' the write inversion unit 610 non-inverts the data. The write inversion unit 610 includes XOR gates like the read inversion unit 433.

The write drivers 621 to 628 transfer data with write inversion information RDBI<0:7> reflected by the write inversion unit 610 to the local lines LIO/LIOB0<0:7> in the bank. The write enable signal WTEN inputted to the write drivers 621 to 628 is enabled in a write operation. The write enable signal WTEN controls the writer drivers 621 to 628 not to operate in a read operation.

FIG. 6 illustrates the write drivers 621 to 628 only, which transfers the data GIO0<0:7> inputted to one data pin DQ0 to the local lines LIO/LIOB0<0:7>. When a memory device includes a quarter bank structure, one of blocks 11, 21, 31, and 41 or the input/output units 12, 22, 32, and 42 includes 64 write drivers, and the write inversion unit 610 includes 64 XOR gates.

A semiconductor memory device according to the related art separately includes write inversion buses WDBI<0:7> for transferring write inversion information and read inversion bus RDBI<0:7> for transferring read inversion information in the memory device. If the write inversion bus WDBI<0:7> and the read inversion bus RDBI<0:7> are separately disposed as described above, the memory device needs more lines to realize an inversion function (DBI function). It is a major factor to increase the size of the memory device.

Therefore, it has been required to reduce the number of lines necessary for embodying the DBI function.

SUMMARY OF THE INVENTION

Embodiments of the present subject matter are directed to providing a method for reducing an overall size of a semiconductor memory device by reducing the number of lines that are necessary for realizing an inversion function, which is a DBI function.

In accordance with an aspect of the present disclosure, there is provided a semiconductor memory device which includes a selector for selectively loading read inversion information and write inversion information on an inversion bus, the inversion bus for transferring the inversion information loaded by the selector, a plurality of read inversion units for reflecting the inversion information from the inversion bus to output data, and a plurality of write inversion units for reflecting the inversion information from the inversion bus to input data.

In accordance with another aspect of the present disclosure, there is provided a semiconductor memory device which includes an inversion generator for generating read inversion information, an inversion input circuit for receiving write inversion information, a selector for selectively loading the read inversion information transferred from the inversion generator and the write inversion information from the inversion input circuit on an inversion bus, the inversion bus for transferring the inversion information loaded by the selector, a plurality of data output circuits for outputting data reflected with the inversion information from the inversion bus, and a plurality of data input circuits for reflecting the inversion information from the inversion bus to input data.

In accordance with another aspect of the disclosure, there is provided a semiconductor memory device which includes an inversion generator for generating read inversion information, an inversion input circuit for receiving write inversion information, a selector for selectively loading the read inversion information from the inversion generator and the write inversion information from the inversion input circuit on an inversion bus, an inversion bus for transferring the inversion information loaded by the selector, a plurality of data output circuits for reflecting the read inversion information from the inversion bus on data and outputting the data, and an input/output unit included in each of banks for reflecting the write inversion information from the inversion bus on input data.

BRIEF DESCRIPTION OF THE DRAWINGS

FIG. 1 is a diagram illustrating a semiconductor memory device having a four-bank quarter structure according to the related art.

DESCRIPTION OF SPECIFIC EMBODIMENTS

Other objects and advantages of the present subject matter can be understood by the following description, and become apparent with reference to the embodiments of the present subject matter.

Figure 7:
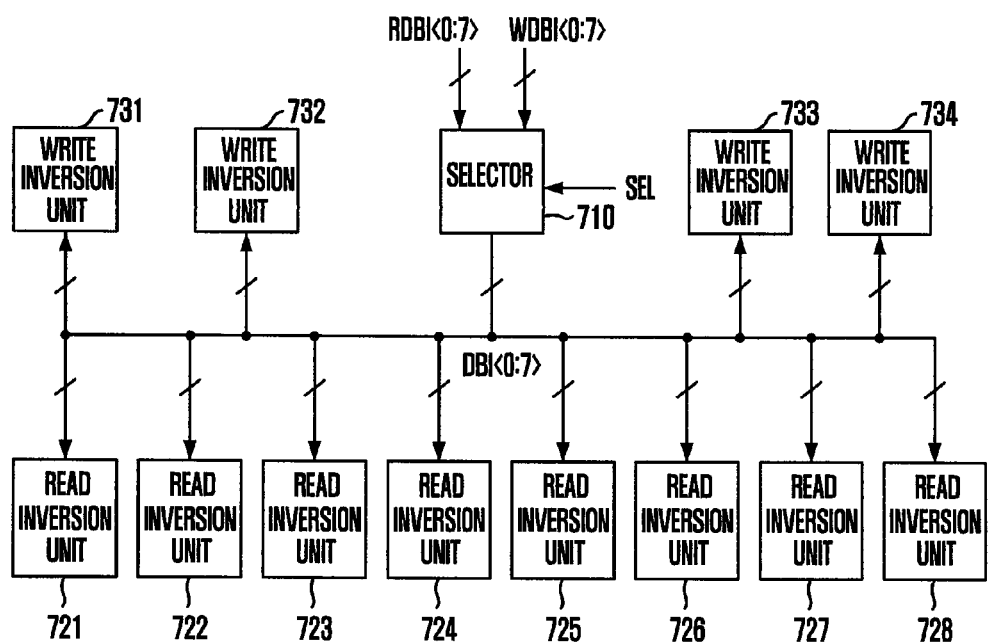
FIG. 7 is a diagram illustrating a semiconductor memory device in accordance with an embodiment of the present subject matter.

FIG. 7 is a diagram illustrating a semiconductor memory device in accordance with an embodiment of the present subject matter.

The semiconductor memory device according to the present embodiment includes a selector 710 for selectively loading read inversion information RDBI<0:7> and write inversion information WDBI<0:7> on an inversion bus DBI<0:7>, the inversion bus DBI<0:7> for transferring the inversion information loaded by the selector 710, a plurality of read inversion units 721 to 728 for reflecting the read inversion information RDBI<0:7> from the inversion bus DBI<0:7> to output data, and a plurality of write inversion units 731 to 734 for reflecting the write inversion information WDBI<0:7> from the inversion bus DBI<0:7> to the input data.

The selector 710 receives the read inversion information RDBI<0:7> and the write inversion information WDBI<0:7>. The read inversion information RDBI<0:7> is generated in the memory device, and the write inversion information WDBI<0:7> is inputted from a memory controller at the outside of the memory device. The selector 710 selectively loads the read inversion information RDBI<0:7> and the write inversion information WDBI<0:7> on the inversion bus DBI<0:7>. In a read operation, the selector 710 transfers the read inversion information RDBI<0:7> to the inversion bus DBI<0:7>. In a write operation, the selector 710 transfers the write inversion information WDBI<0:7> to the inversion bus DBI<0:7>. The selection signal SEL inputted to the selector 710 is enabled in a write operation, and is disabled in a read operation, thereby controlling the selector 710.

The inversion bus DBI<0:7> is a bus transferring both of the read inversion information RDBI<0:7> and the write inversion information WDBI<0:7>. In a read operation of a memory device, the read inversion information RDBI<0:7> is only used. In a write operation of a memory device, the write inversion information WDBI<0:7> is only used. Therefore, it is possible to use only one bus to transfer the read inversion information RDBI<0:7> and the write inversion information WDBI<0:7> because the read inversion information RDBI<0:7> and the write inversion information WDBI<0:7> are not transferred at the same time.

The read inversion units 721 to 728 reflect the read inversion information RDBI<0:7> from the inversion bus DBI<0:7> to the output data. The output data is data outputted from a memory device. The read inversion units 721 to 728 may be disposed at different locations in a memory device according to the configuration of the memory device. In general, the read inversion units 721 to 728 are disposed in a data output circuit disposed in each data pin like the data output circuit according to the related art.

The write inversion units 731 to 734 reflect the write inversion information WDBI<0:7> from the inversion bus DBI<0:7> to input data. The input data is inputted from the outside of the memory device in a write operation and stored in the memory device. Since data is inverted or non-inverted according to the write inversion information WDBI<0:7> when the data from the outside is stored in the memory device, the write inversion units 731 to 734 are necessary to have in the memory device for supporting the DBI function. The write inversion units 731 to 734 may be disposed in front of the write driver in the input/output unit of the bank as described above. Or it may be disposed in other locations.

In case that the write inversion units 731 to 734 are disposed in the input/output unit of the bank, the write inversion units 731 to 734 are disposed as many as the number of banks. Therefore, a memory device having a quarter bank structure includes the write inversion units as many as four times of the number of banks.

In the present embodiment, the write inversion information WDBI<0:7> and the read inversion information RDBI<0:7> are transferred to a memory device through the shared inversion bus DBI<0:7>. Since the inversion bus DBI<0:7> transfers inversion information RDBI<0:7> or WDBI<0:7> to several parts in a memory device, the inversion bus DBI<0:7> must be relatively long. Therefore, the inversion bus DBI<0:7> occupies a large area. However, the write inversion bus and the read inversion bus are integrated into one inversion bus DBI<0:7> in the present embodiment, thereby reducing an area for the inversion bus DBI<0:7> by half. Therefore, an overall size of the memory device is reduced.

Figure 8:
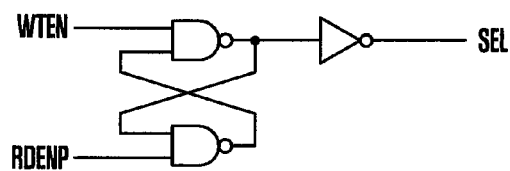
FIG. 8 is a diagram illustrating a method for generating a selection signal SEL that controls a selector 710.

FIG. 8 is a diagram illustrating a method for generating a selection signal SEL that controls a selector 710.

The selection signal SEL may be generated by a write enable signal WTEN and a read enable signal RDENP. The write enable signal WTEN is a signal enabled in a write operation, and the read enable signal RDENP is a signal enabled in a read operation.

In FIG. 8, a SR latch receives the write enable signal WTEN as a set signal and receives the read enable signal RDENP as a reset signal. Also, the SR latch outputs a selection signal SEL. Therefore, the selection signal SEL is enabled at the same time when the write enable signal WTEN is enabled, and is disabled at the same time when the read enable signal RDENP is enabled.

The selection signal SEL is a signal for identifying a write operation and a read operation. Although the SR latch is used to generate the selection signal SEL in FIG. 8, the selection signal SEL can be generated through various methods.

Figure 9:
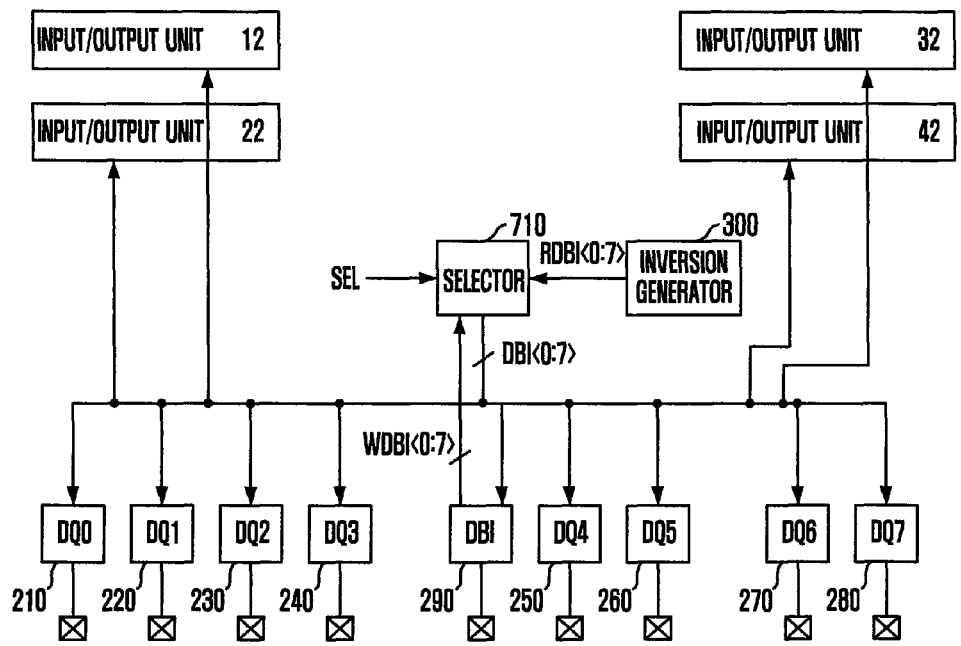
FIG. 9 is a diagram illustrating a semiconductor memory device in according to the first embodiment of the present subject matter.

FIG. 9 is a diagram illustrating a semiconductor memory device according to the first embodiment of the present subject matter.

That is, FIG. 9 shows a semiconductor memory device employing a method for generating a selection signal SEL of FIG. 8.

That is, the semiconductor memory device according to the first embodiment includes write inversion units 731 and 734 of FIG. 7 in input/output units 12, 22, 32, and 42, and read inversion units 721 to 728 in the data output circuits 210 to 280. For convenience, global lines are not shown in FIG. 9.

Referring to FIG. 9, DQ blocks 210 to 280 are disposed in data input circuits and data output circuits of each data pin. A DBI block 290 includes an inversion input circuit and an inversion output circuit in a DBI pin.

The semiconductor memory device according to the first embodiment includes an inversion generator 300 for generating a read inversion information RDBI<0:7>, an inversion input circuit 290 for receiving write inversion information WDBI<0:7>, a selector 710 for selectively loading one of the read inversion information RDBI<0:7> from the inversion generator 300 and the write inversion information WDBI<0:7> from the inversion input circuit 290, an inversion bus DBI<0:7> for transferring inversion information loaded by the selector, a plurality of data output circuits 210 to 280 for outputting data by reflecting the read inversion information RDBI<0:7> from the inversion bus DBI<0:7>, and input/output units 12, 22, 32, and 42 disposed in each of banks for reflecting write inversion information WDBI<0:7> from the inversion bus DBI<0:7> to input data.

The inversion bus DBI<0:7> is connected to an inversion output circuit 290 because the inversion output circuit 290 needs to output the read inversion information RDBI<0:7> to the outside of the memory device, and because the inversion output circuit 290 needs to receive the read inversion information RDBI<0:7> from the inversion bus DBI<0:7>.

The selector 710 was described with reference to FIG. 7, and the data input circuit and the data output circuit in the DQ blocks 210 to 280 were already described in detail. The inversion input circuit and the inversion output included in the DBI block 290 were already described. Furthermore, the inversion generator 300 and the input/output units 12, 22, 32, and 42 were described. Therefore, detail description thereof is omitted.

In the present embodiment, the read inversion information RDBI<0:7> from the inversion generator 300 and the write inversion information WDBI<0:7> from the inversion input circuit 290 are transferred through the inversion bus DBI<0:7>. The inversion bus DBI<0:7> connected to each of constituent elements of the memory device requiring the inversion information for transferring the inversion information. Since the same inversion bus DBI<0:7> is used to transfer the read inversion information RDBI<0:7> and the write inversion information WDBI<0:7>, an area of the inversion bus DBI<0:7> in the semiconductor memory can be reduced by half.

Figure 10:
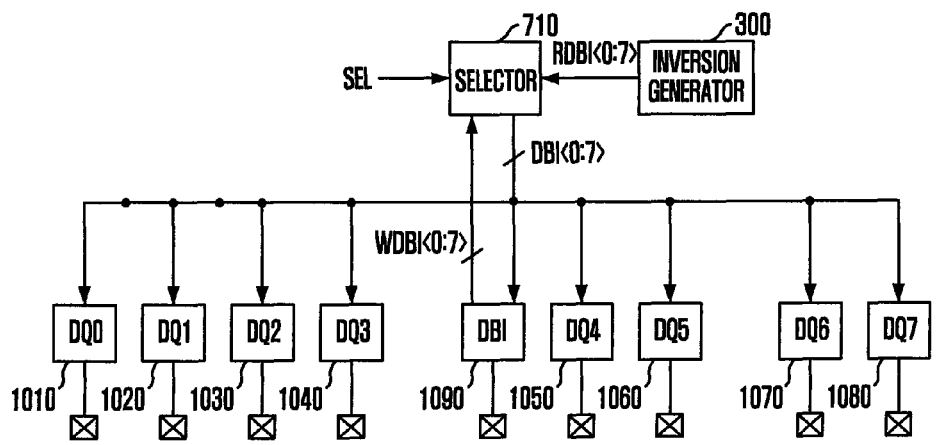
FIG. 10 is a diagram illustrating a semiconductor memory device in according to the second embodiment of the present invention.

FIG. 10 is a diagram illustrating a semiconductor memory device according to the second embodiment of the present subject matter.

That is, FIG. 10 shows a semiconductor memory device having a data input circuit for reflecting write inversion information to data and employing a method for generating a selection signal SEL. For convenience, the global bus GIO is not shown in FIG. 10.

In FIG. 10, each of data pins includes DQ blocks 1010 to 1080 having a data input circuit and a data output circuit. A DBI pin includes a DBI block 1090 having an inversion input circuit and an inversion output circuit.

The semiconductor memory device according to the present embodiment includes an inversion generator 300 for generating read inversion information RDBI<0:7>, an inversion input circuit 1090 for receiving write inversion information WDBI<0:7>, a selector 710 for selectively loading the read inversion information RDBI<0:7> from the inversion generator 300 and the write inversion information WDBI<0:7> from the inversion input circuit 1090 on the inversion bus DBI<0:7>, an inversion bus DBI<0:7> for transferring the inversion information loaded by the selector 710, a plurality of data output circuits 1010 to 1080 for outputting data by reflecting the read inversion information RDBI<0:7> from the inversion bus DBI<0:7>, and a plurality of data input circuits 1010 to 1080 for reflecting the write inversion information WDBI<0:7> from the inversion bus DBI<0:7> to the input data.

The semiconductor memory device according to the present embodiment includes an inversion output circuit 1090 for outputting read inversion information RDBI<0:7> received from the inversion bus DBI<0:7>.

In FIG. 10, data input circuits 1010 to 1080 inverts and non-inverts output inputted from the outside according to the write inversion information WDBI<0:7>. That is, the data input circuits 1010 to 1080 include the write inversion units 731 to 734 which were described in FIG. 7. In FIG. 10, data with the write inversion information WDBI<0:7> reflected is transferred from the data input circuits 1010 to 1080 to the input/output units 12, 22, 32, and 42 of a bank, or an Y block (not shown in FIG. 10). Therefore, the inversion bus DBI<0:7> is not connected to the input/output units 12, 22, 32, and 42 because it is not necessary to transfer the write inversion information WDBI<0:7> to the input/output units 12, 22, 32, and 42 of the bank.

Figure 11:
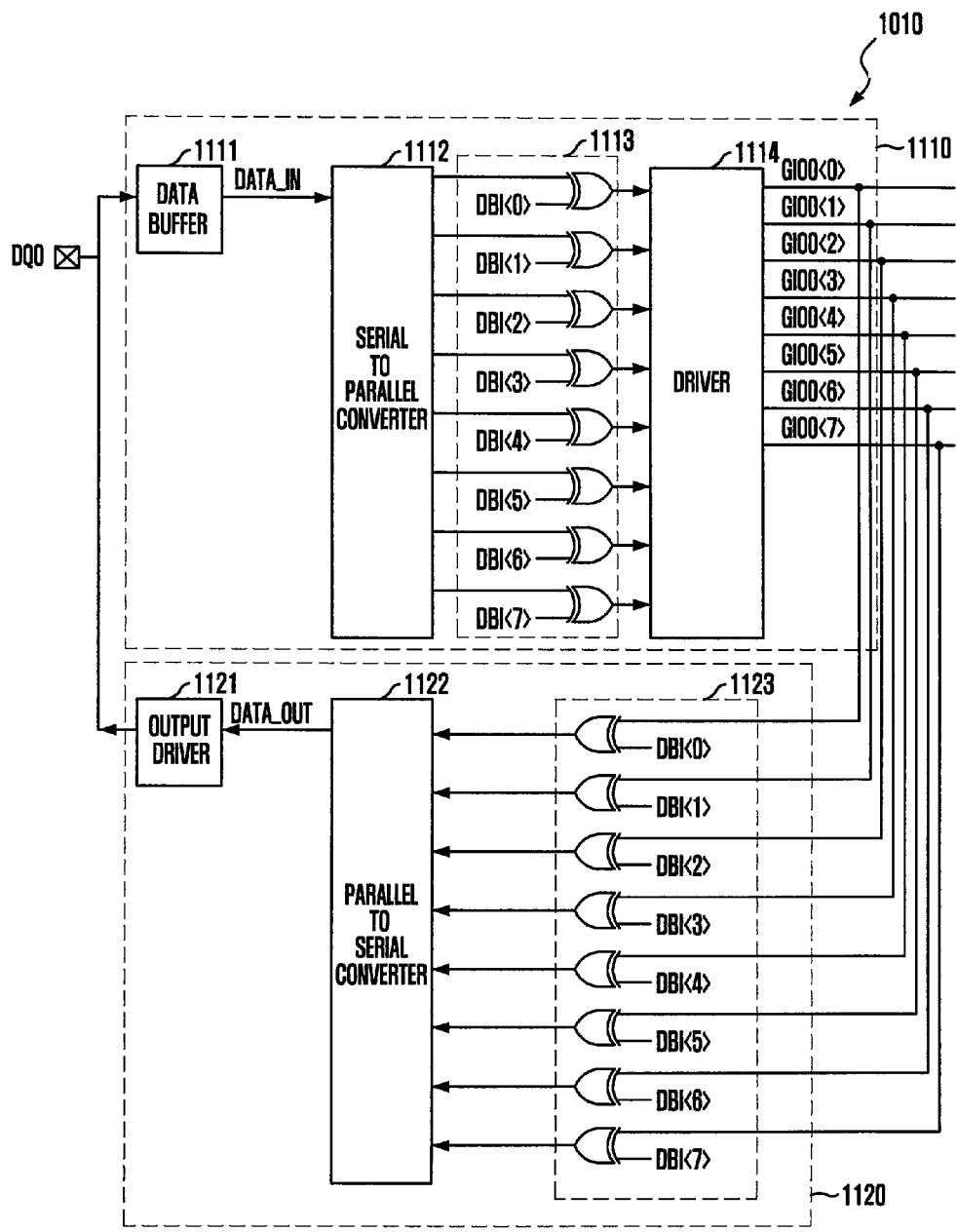
FIG. 11 is a diagram illustrating a DQ block 1010 of FIG. 10.

FIG. 11 is a diagram illustrating a DQ block 1010 of FIG. 10.

As shown in FIG. 11, the DQ block 1010 includes an input circuit 1110 and a data output circuit 1120.

The data input circuit 1110 includes a data buffer 1111, a serial to parallel converter 1112, a write inversion unit 1113, and a driver 1114.

Figure 2:
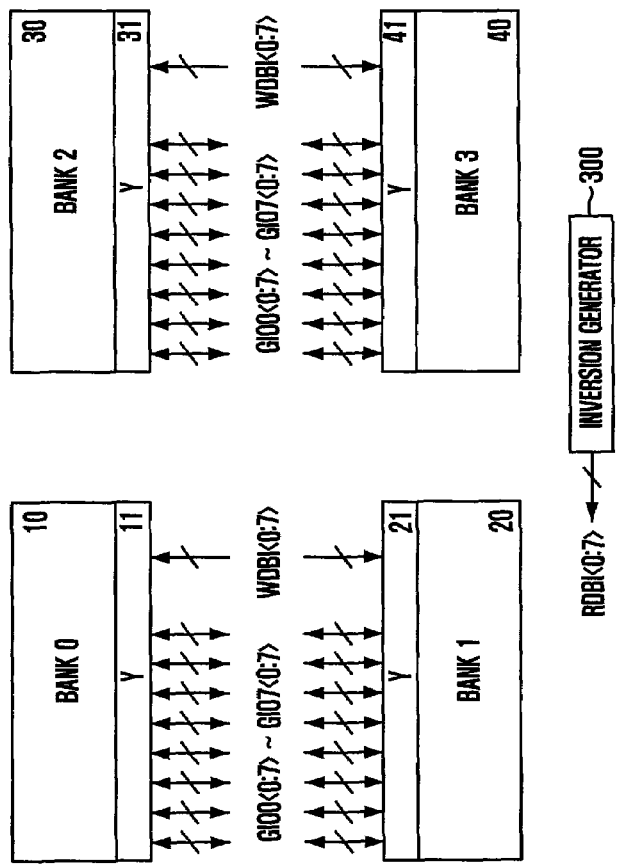
FIG. 2 is a diagram illustrating exchanging data and inversion information between data input circuits and banks.
Figure 2:
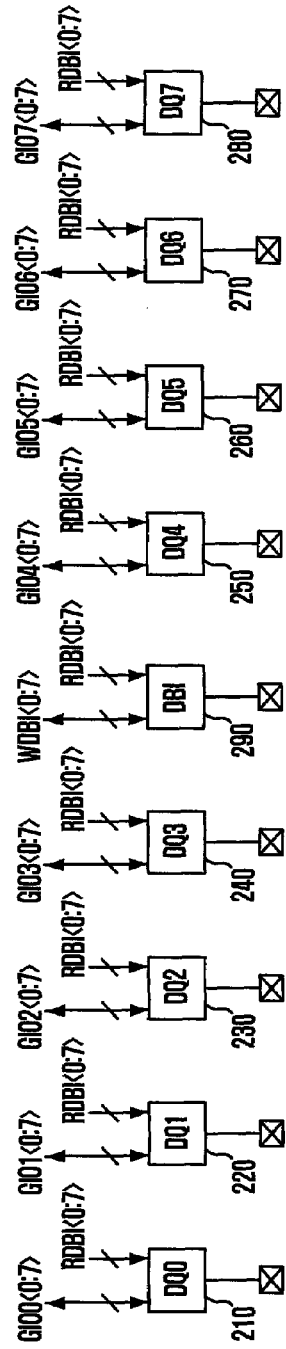
Figure 3:
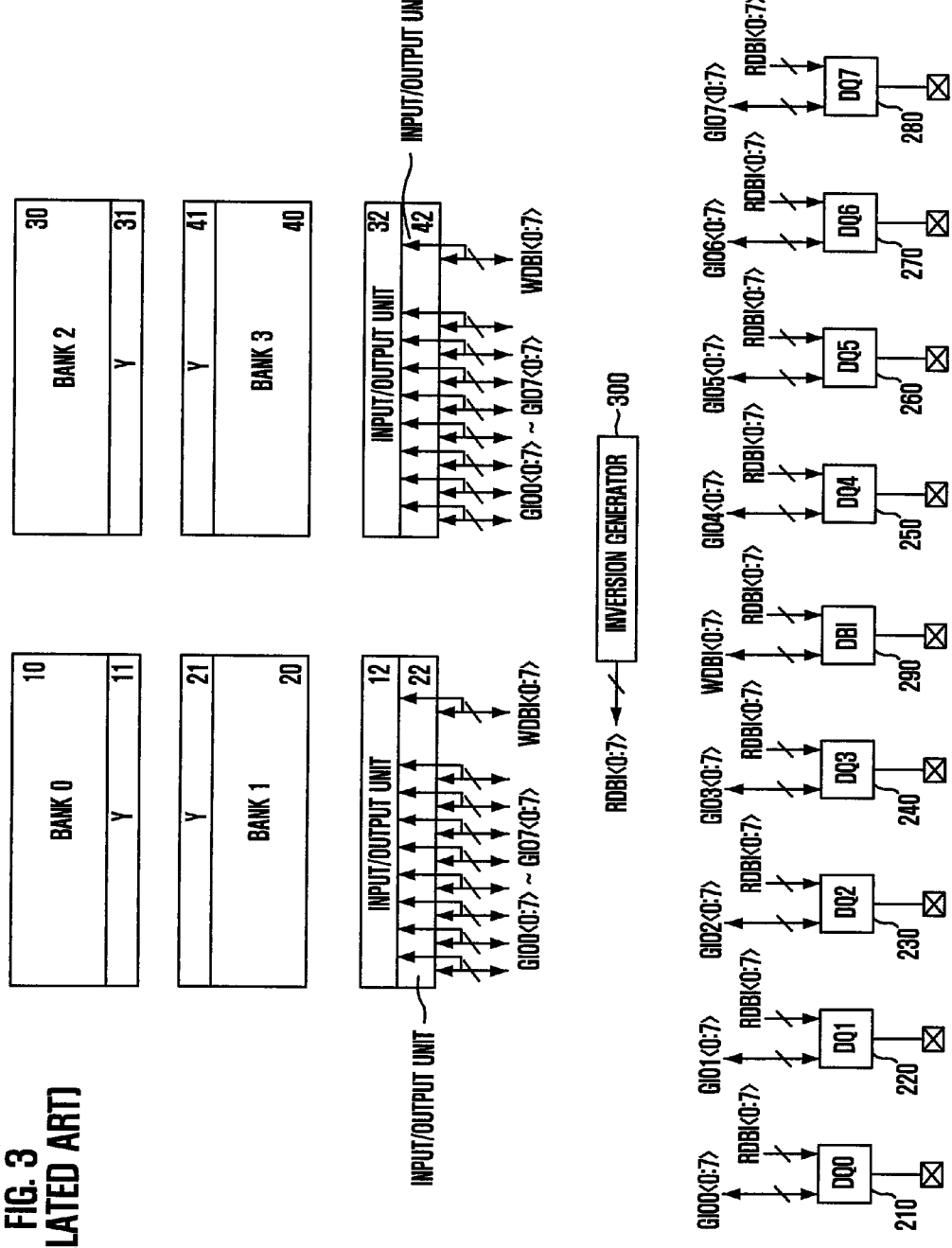
FIG. 3 is a diagram illustrating exchanging data and inversion information between data input circuits 210 to 280 and banks 10 to 40 like FIG. 2.
Figure 4:
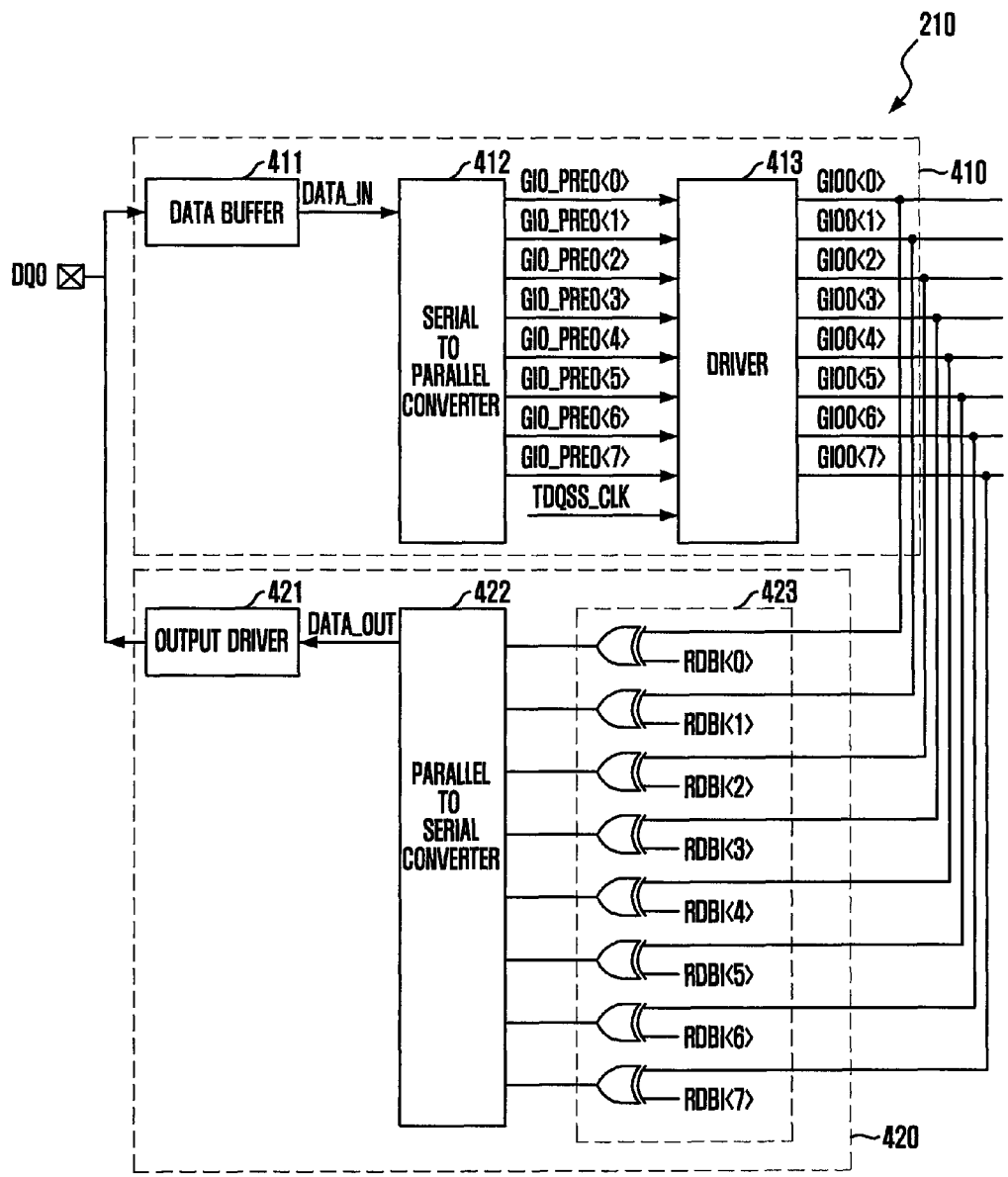
FIG. 4 is a diagram illustrating a data input circuit and a data output circuit in a DQ block 210 of FIG. 2.

That is, the data input circuit 1110 includes the structure of the data input circuit of FIG. 4 with a write inversion unit.

The write inversion unit 1113 receives the write inversion information WDBI<0:7> from the inversion bus DBI<0:7>, inverts or non-inverts the input data according to the write inversion information WDBI<0:7>, and outputs the inverted or non-inverted data. The write inversion unit 1113 includes XOR gates as shown in FIG. 11.

The driver 1114 loads data with the write inversion information WDBI<0:7> reflected by the write inversion unit 1113 on the global line GIO0<0:7>. Since the data input circuit 1110 reflects the write inversion information WDBI<0:7> to data, it is not necessary to include the input/output units 12, 22, 32, and 42 like the related art.

The data input circuit 1110 transfers the data reflected with the write inversion information WDBI<0:7> to the global bus GIO0<0:7> instead of simply transferring the data to the global bus GIO0<0:7>. Therefore, it is required to additionally tune a timing because margin is changed compared with the related art. Since the timing tuning is well known to those skilled in the art, detail description thereof is omitted.

The data output circuit 1120 includes an output driver 1121, a parallel-to-serial converter 1122, and a read inversion unit 1123.

The output circuit 1120 has the same structure of the data output circuit 420 of FIG. 4. Although the read inversion unit 423 according to the related art receives the read inversion information through the read inversion bus, the output circuit 1120 receives the read inversion information RDBI<0:7> through the inversion sub DBI<0:7> in the present embodiment.

Figure 12:
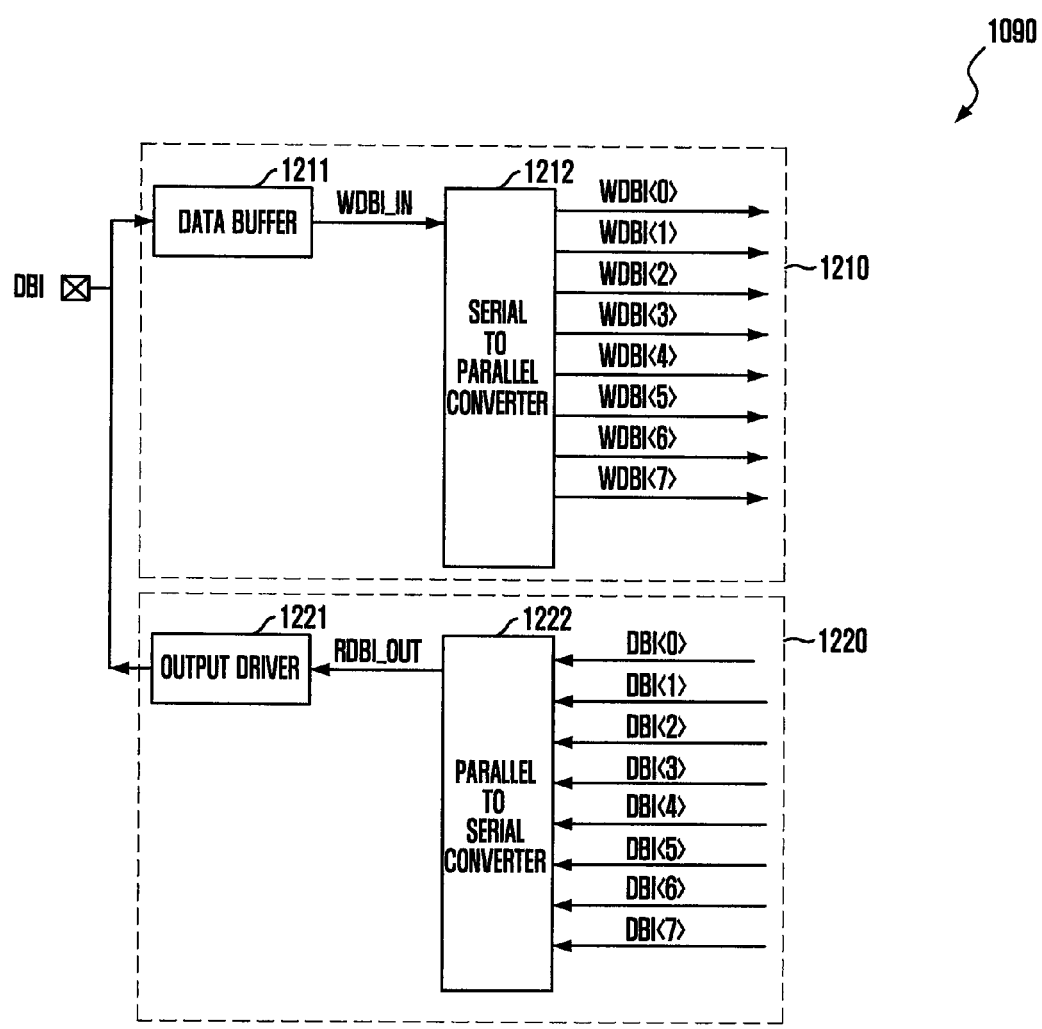
FIG. 12 is a diagram illustrating a DBI block 1090 of FIG. 10.

FIG. 12 is a diagram illustrating a DBI block 1090 of FIG. 10.

The DBI block 1090 includes an inversion input circuit 1210 and an inversion output circuit 1220.

The inversion input circuit 1210 includes an inversion buffer 1211 and a serial-to-parallel converter 1212.

Figure 5:
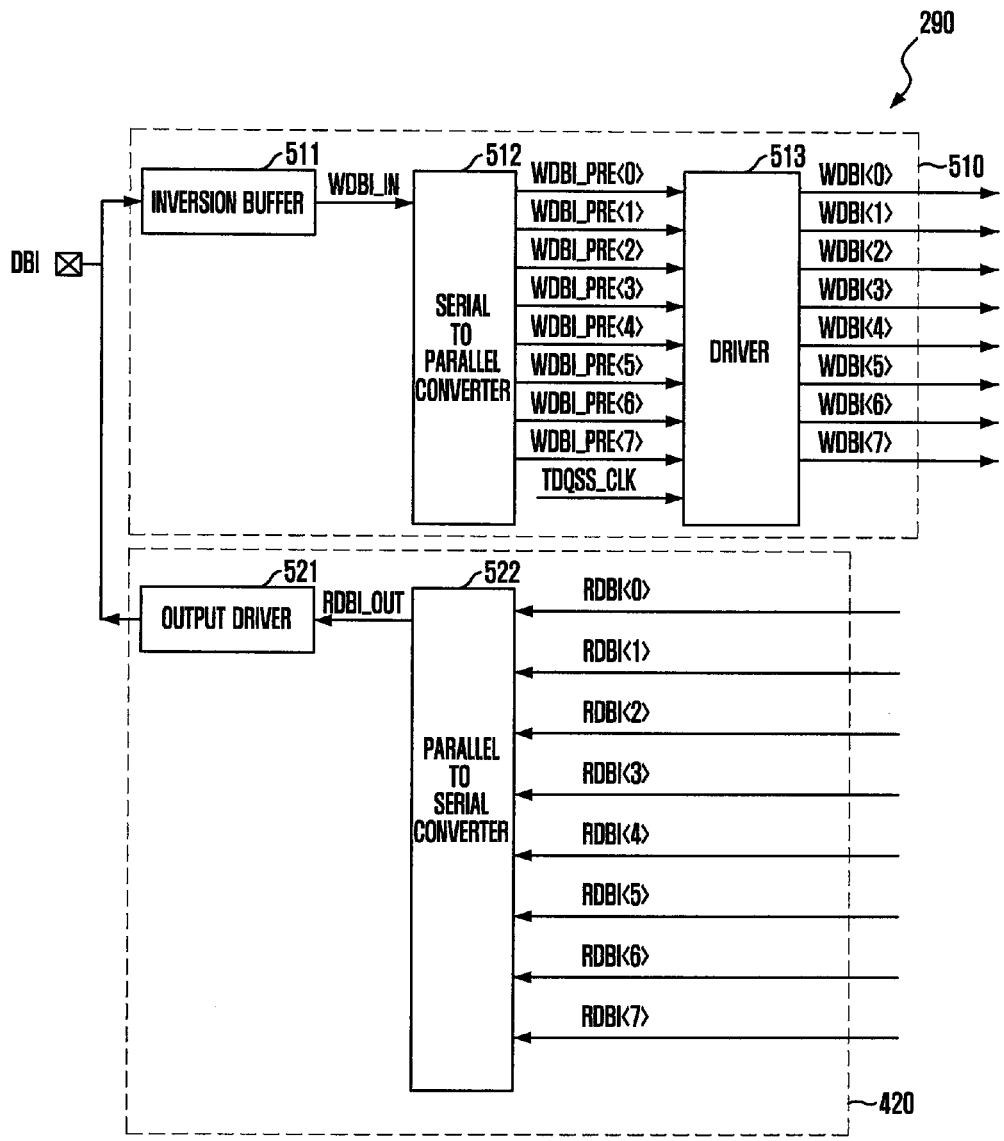
FIG. 5 is a diagram illustrating an inversion input circuit and an inversion output circuit in a DBI block 290 of FIG. 2.
Figure 6:
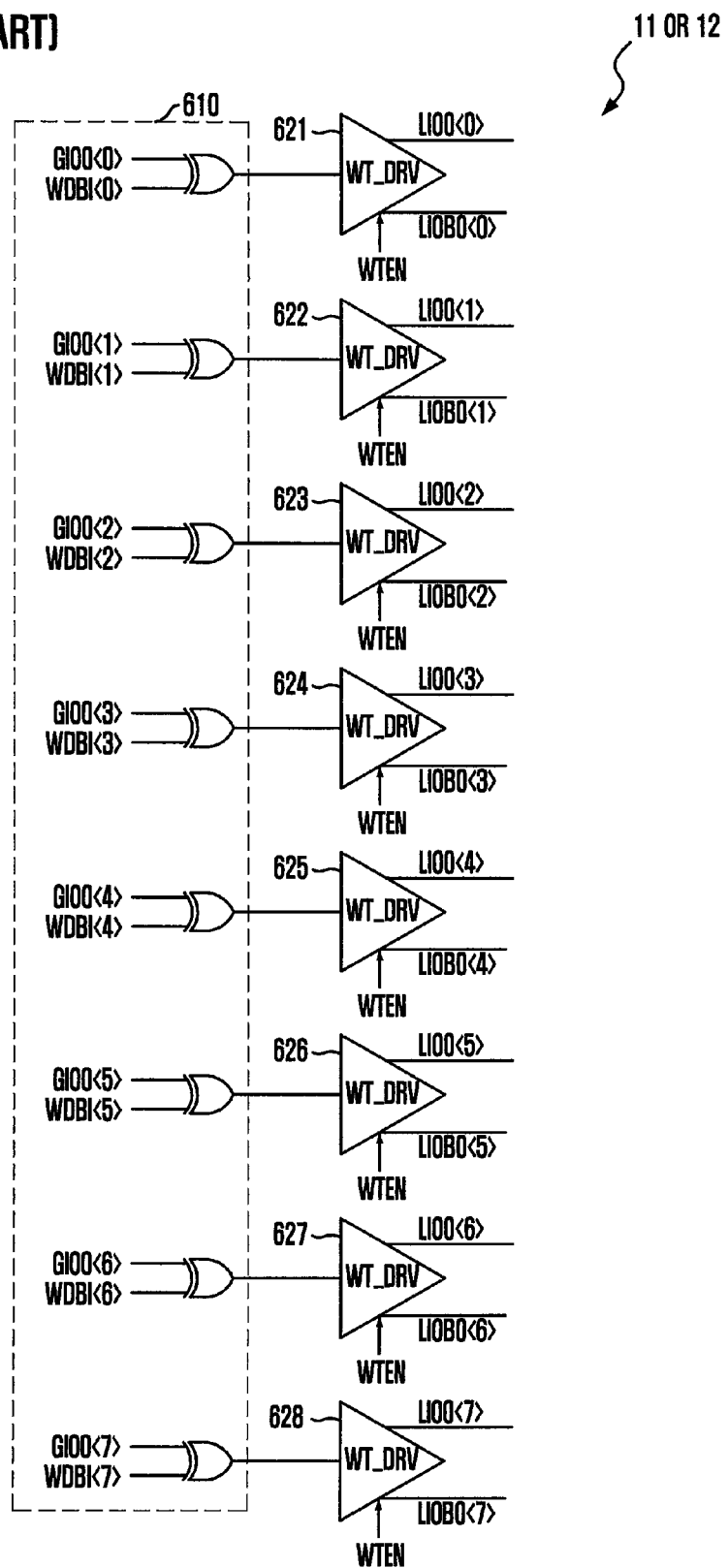
FIG. 6 is a diagram illustrating write drivers and write inversion units in an input/output unit 12 of FIG. 3 and a Y block 11 of FIG. 2.

The inversion input circuit 1210 has the same structure of the inversion buffer 510 of FIG. 5 without the driver 513. The write inversion information WDBI<0:7> inputted to the inversion input circuit 1210 is transferred to each of the data input circuits 1010 to 1080 through the inversion bus DBI<0:7>, and data with the write inversion information WDBI<0:7> reflected in the data input circuits 1010 to 1080 is strobed according to a clock TDQSS_CLK. Therefore, it is not necessary for the inversion input circuit 1210 to strobe the write inversion information WDBI<0:7>.

The inversion output circuit 1220 includes a parallel-to-serial converter 1222 and an output driver 1222. The inversion output circuit 1220 may have the same structure of the inversion output circuit 520 of FIG. 5.

Embodiments of the present subject matter relate to a semiconductor memory device. The semiconductor memory device does not include a write inversion bus and a read inversion bus separately and transfers write inversion information and read inversion information through a common inversion bus. Therefore, the number of lines for processing inversion information is reduced by half in the present subject matter. Therefore, the overall size of the semiconductor memory device is significantly reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a selector for selectively loading read inversion information and write inversion information on an inversion bus;
   the inversion bus for transferring the inversion information loaded by the selector;
   a plurality of read inversion units for reflecting the inversion information from the inversion bus to output data; and
   a plurality of write inversion units for reflecting the inversion information from the inversion bus to input data.

2. The semiconductor memory device of claim 1, wherein the selector loads the read inversion information on the inversion bus in a read operation and loads the write inversion information on the inversion bus in a write operation.

3. The semiconductor memory device of claim 1, wherein the selector operates in response to a control signal that is enabled by a write enable signal and disabled by a read pulse.

4. The semiconductor memory device of claim 1, wherein the plurality of read inversion units are included in each data output circuit.

5. The semiconductor memory device of claim 1, wherein the plurality of write inversion units are included in each data input circuit.

6. The semiconductor memory device of claim 1, wherein the plurality of write inversion units are included in each of input/output units of a bank.

7. A semiconductor memory device, comprising:
- an inversion generator for generating read inversion information;
- an inversion input circuit for receiving write inversion information;
- a selector for selectively loading the read inversion information transferred from the inversion generator and the write inversion information from the inversion input circuit on an inversion bus;
- the inversion bus for transferring the inversion information loaded by the selector;
- a plurality of data output circuits for outputting data reflected with the inversion information from the inversion bus; and
- a plurality of data input circuits for reflecting the inversion information from the inversion bus to input data.

8. The semiconductor memory device of claim 7, further comprising an inversion output circuit for outputting the inversion information from the inversion bus to an outside of the semiconductor memory device.

9. The semiconductor memory device of claim 7, wherein the selector loads the read inversion information on the inversion bus in a read operation and loads the write inversion information on the inversion bus in a write operation.

10. The semiconductor memory device of claim 7, wherein a data pin of the semiconductor memory device includes the data output circuit and the data input circuit.

11. A semiconductor memory device, comprising:
- an inversion generator for generating read inversion information;
- an inversion input circuit for receiving write inversion information;
- a selector for selectively loading the read inversion information from the inversion generator and the write inversion information from the inversion input circuit on an inversion bus;
- the inversion bus for transferring the inversion information loaded by the selector;
- a plurality of data output circuits for reflecting the read inversion information from the inversion bus on data and outputting the data; and
- an input/output unit included in each of banks for reflecting the write inversion information from the inversion bus on input data.

12. The semiconductor memory device of claim 11, further comprising an inversion output circuit for outputting the read inversion information from the inversion bus to an outside of the semiconductor memory device.

13. The semiconductor memory device of claim 11, wherein the selector loads the read inversion information on the inversion bus in a read operation and loads the write inversion information on the inversion bus in a write operation.

* * * * *